(12) United States Patent
Su et al.

(10) Patent No.: US 9,960,217 B2
(45) Date of Patent: *May 1, 2018

(54) DISPLAY PANEL AND SYSTEM FOR DISPLAYING IMAGES UTILIZING THE SAME

(71) Applicant: InnoLux Corporation, Miao-Li County (TW)

(72) Inventors: Tsung-Yi Su, Miao-Li County (TW); Yu-Hung Dai, Miao-Li County (TW); Chang-Ho Tseng, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 215 days.

This patent is subject to a terminal disclaimer.

(21) Appl. No.: 14/988,046

(22) Filed: Jan. 5, 2016

(65) Prior Publication Data

US 2016/0126300 A1    May 5, 2016

Related U.S. Application Data

(63) Continuation of application No. 14/219,479, filed on Mar. 19, 2014, now Pat. No. 9,263,508, which is a
(Continued)

(30) Foreign Application Priority Data

Apr. 13, 2009 (TW) .............................. 98112151 A

(51) Int. Cl.
*H01J 1/62* (2006.01)
*H01L 27/32* (2006.01)
(Continued)

(52) U.S. Cl.
CPC ...... *H01L 27/3246* (2013.01); *H01L 27/3276* (2013.01); *H01L 27/3258* (2013.01); *H01L 51/5203* (2013.01); *H05B 33/06* (2013.01)

(58) Field of Classification Search
CPC ....... H01L 51/50; H01L 51/52; H01L 51/503; H01L 27/3246; H01L 27/3276; H01L 27/3258; H01L 27/01
(Continued)

(56) References Cited

U.S. PATENT DOCUMENTS 6,190,934 B1   2/2001   Kang et al.
6,633,361 B1   10/2003  Fujita
(Continued)

FOREIGN PATENT DOCUMENTS

| CN | 1622699 | 6/2005 |
|---|---|---|
| CN | 101393925 | 3/2009 |
| CN | TW 200737292 | 3/2009 |
| JP | 2003016946 | 1/2003 |
| KR | 2004102516 | 12/2004 |
| TW | 200737292 | 8/2008 |

OTHER PUBLICATIONS

Chinese language office action dated Apr. 3, 2013, issued in application No. CN 200910135642.1.
(Continued)

*Primary Examiner* — Vip Patel
(74) *Attorney, Agent, or Firm* — McClure, Qualey & Rodack, LLP

(57) ABSTRACT

A display panel is provided. The display panel includes a substrate having a pixel region and a peripheral region, a control element overlying the pixel region of the substrate, a first metal layer overlying the substrate in the peripheral region and in the pixel region, a first insulating layer formed on the first metal layer in the peripheral region, wherein the first insulating layer includes at least an opening, and the opening is disposed on the first metal layer, a second metal layer overlying the first insulating layer and electrically
(Continued)

connected to the first metal layer, wherein a portion of the second metal layer is disposed in the opening, a second insulating layer overlying the second metal layer, and an electrode layer disposed on the second insulating layer.

20 Claims, 11 Drawing Sheets

Related U.S. Application Data continuation of application No. 12/758,123, filed on Apr. 12, 2010, now Pat. No. 8,716,927.

(51) Int. Cl.
    *H01L 51/52*     (2006.01)
    *H05B 33/06*     (2006.01)

(58) Field of Classification Search
    USPC .......................... 313/506, 512, 498
    See application file for complete search history.

(56) References Cited

U.S. PATENT DOCUMENTS

| | | |
|---|---|---|
| 6,771,348 B2 | 8/2004 | Oh et al. |
| 7,133,102 B2 | 11/2006 | Choi et al. |
| 7,476,899 B2 | 1/2009 | Motoshima et al. |
| 7,663,728 B2 | 2/2010 | Ko et al. |
| 7,692,377 B2 | 4/2010 | Nakamura et al. |
| 7,701,132 B2 | 4/2010 | Oh |
| 8,063,550 B2 | 11/2011 | Kim et al. |
| 8,148,724 B2 | 4/2012 | Lee et al. |
| 2002/0113934 A1 | 8/2002 | Aoki |
| 2003/0034497 A1 | 2/2003 | Yamazaki et al. |
| 2008/0164812 A1 | 7/2008 | Tsai et al. |

OTHER PUBLICATIONS

Chinese language office action dated Oct. 31, 2012, issued in application No. CN 200910135642.1.

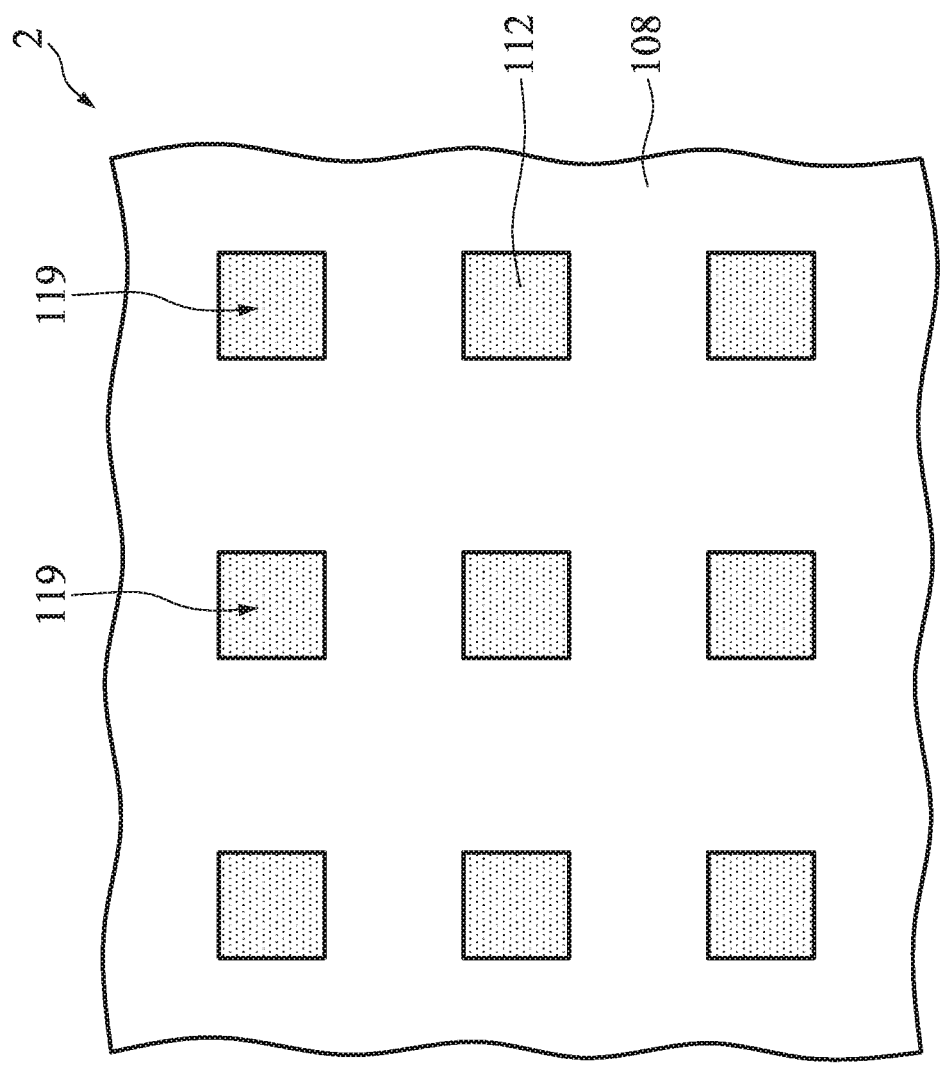

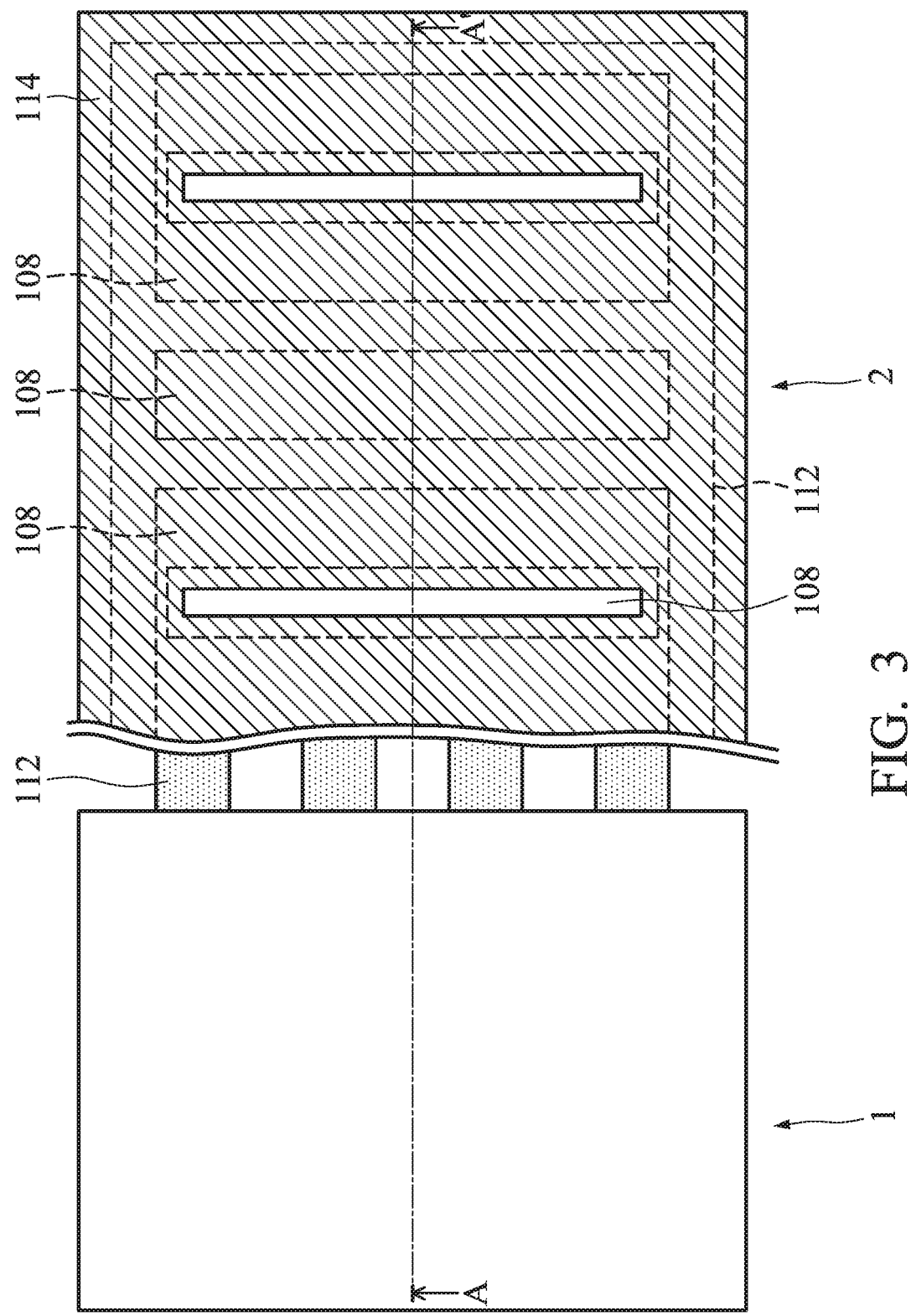

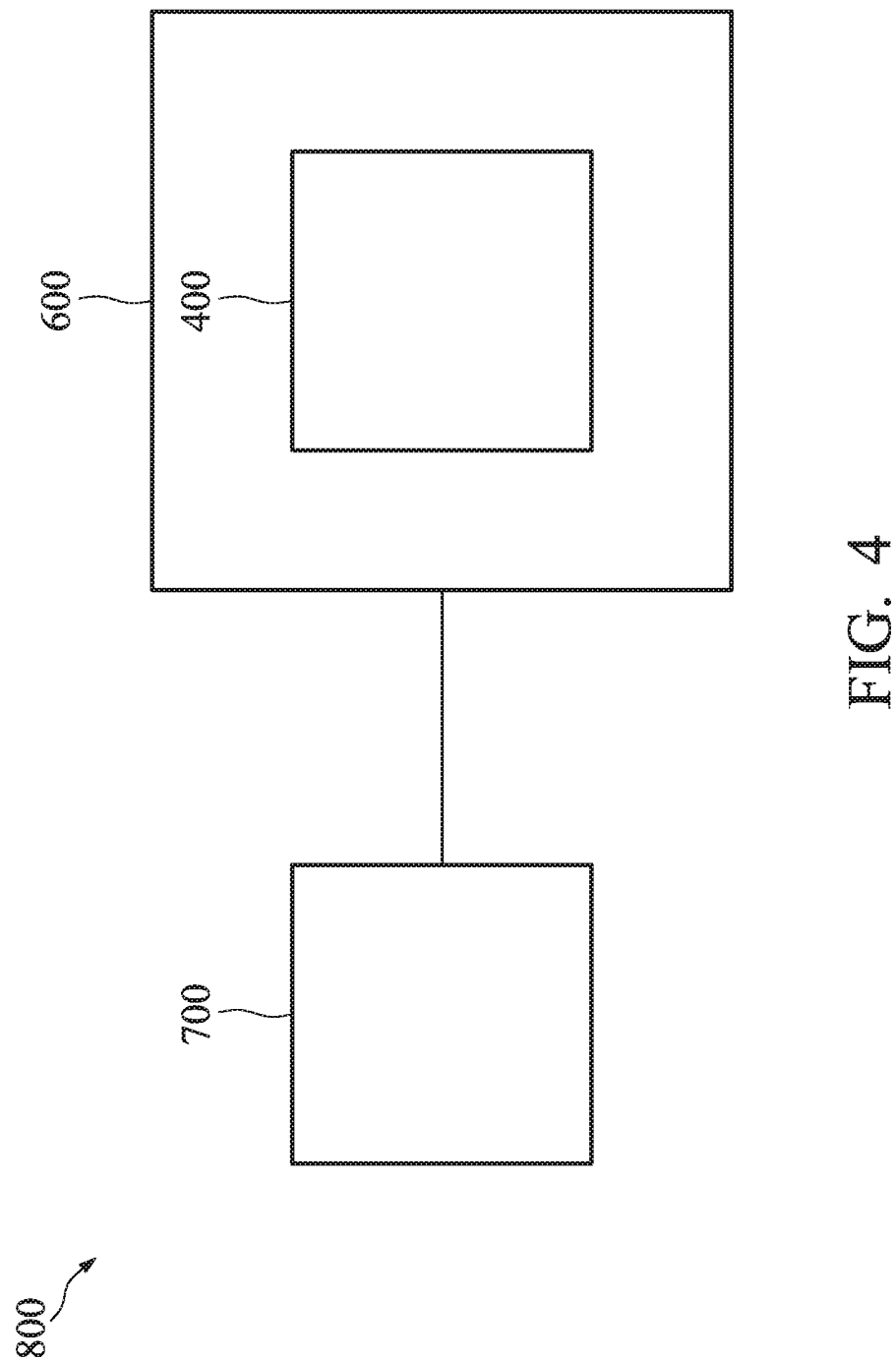

DISPLAY PANEL AND SYSTEM FOR DISPLAYING IMAGES UTILIZING THE SAME

CROSS REFERENCE TO RELATED APPLICATIONS

This Application is a Continuation of U.S. patent application Ser. No. 14/219,479, filed on Mar. 19, 2014, which is a Continuation of U.S. application Ser. No. 12/758,123, filed on Apr. 12, 2010 (now Utility Patent No. 8,716,927, issued on May 6, 2014), which claims priority of Taiwan Patent Application No. 98112151, filed on Apr. 13, 2009, the entirety of which is incorporated by reference herein.

BACKGROUND OF THE INVENTION

Field of the Invention

The present invention relates to a display panel and a system for displaying images utilizing the same, and in particular relates to an AM-OLED panel and design method thereof.

Description of the Related Art

Active light emitting devices, such as light emitting diodes and organic light emitting diodes, have been widely used in flat panel displays, wherein active-matrix organic light emitting diode (AM-OLED) panels have attracted much attention due to characteristics, such as thin dimension, light weight, spontaneous luminescence with high luminance efficiency, low power consumption, wide viewing angle, high contrast, high-response speed, and full color.

For AM-OLED panels, wide and long metal traces, for example metal traces having widths larger than 100 μm, are generally used as power lines around a peripheral region of the panel for providing power needed for display. The metal traces in the peripheral region and electrode layers (anode or cathode) in a pixel region may be in the same layer formed simultaneously. However, the metal traces in the peripheral region are relatively wide and occupy a relatively large area. Thus, the surface topography (or surface morphology) of the metal traces is quite different from that of the electrode layers in the pixel region. For example, the metal traces in the peripheral region may have insufficient surface roughness, thus negatively affecting the quality of the subsequently formed material layers. For example, an insulating layer formed overlying the metal traces in the peripheral region may be too thin to effectively isolate two metal traces underlying and overlying the insulating layer, respectively. Thus, a short may occur between the two metal traces, negatively and seriously affecting the operation of the display panel. Moreover, because the metal traces in the peripheral region have a relatively large area, high stress may be generated in the metal traces.

Therefore, a display panel having improved quality is desired.

BRIEF SUMMARY OF THE INVENTION

In accordance with an embodiment of the invention, a display panel is provided, which includes a substrate having a pixel region and a peripheral region, a control element overlying the pixel region of the substrate, a first metal layer overlying the substrate in the peripheral region and in the pixel region, a first insulating layer formed on the first metal layer in the peripheral region, wherein the first insulating layer comprises at least an opening, and the opening is disposed on the first metal layer, a second metal layer overlying the first insulating layer and electrically connected to the first metal layer, wherein a portion of the second metal layer is disposed in the opening, a second insulating layer overlying the second metal layer, and an electrode layer disposed on the second insulating layer.

In accordance with another embodiment of the invention, an electronic element is provided, which includes a display element including a display panel. The display panel includes a substrate having a pixel region and a peripheral region, a control element overlying the pixel region of the substrate, a first metal layer overlying the substrate in the peripheral region and in the pixel region, a first insulating layer formed on the first metal layer in the peripheral region, wherein the first insulating layer comprises at least an opening, and the opening is disposed on the first metal layer, a second metal layer overlying the first insulating layer and electrically connected to the first metal layer, wherein a portion of the second metal layer is disposed in the opening, a second insulating layer overlying the second metal layer, and an electrode layer disposed on the second insulating layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 2A-2D are top views showing the insulating layer overlying the conducting layer according to embodiments of the present invention;

FIG. 3 is a top view showing a portion of a display panel according to an embodiment of the present invention; and FIG. 4 is a schematic diagram showing a system for displaying images according to an embodiment of the present invention.

DETAILED DESCRIPTION OF THE INVENTION

By designing openings in an insulating layer underlying a conducting trace, for example a metal trace, formed in a peripheral region in a display panel of an embodiment of the invention, the surface morphology of the conducting trace may be adjusted to further ensure a subsequently formed insulating layer having a sufficient thickness. Thus, short between an upper electrode layer and a lower electrode layer serving as conducting traces in the peripheral region may be prevented.

FIGS. 1A-1E are cross-sectional views showing the steps for forming a display panel in accordance with an embodiment of the present invention. FIG. 3 is a top view showing a portion of a display panel in accordance with an embodiment of the present invention, wherein the cross-sectional views shown in FIGS. 1A-1D are taken along the line A-A' of FIG. 3. For simplicity, detailed elements in a pixel region are not shown in FIG. 3.

Figure 1A:
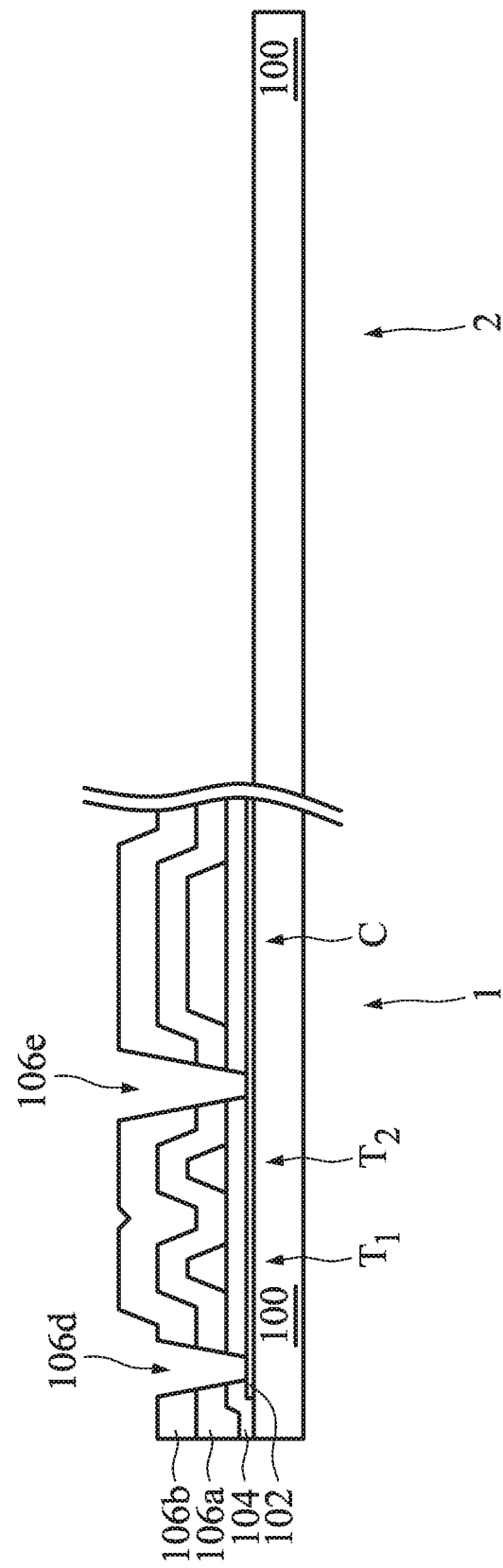
FIGS. 1A-1E are cross-sectional views showing the steps for forming a display panel according to an embodiment of the present invention.

As shown in FIG. 1A, a substrate 100 is provided, which has a pixel region 1 and a peripheral region 2. In one embodiment, a buffer layer (not shown) may be formed overlying the substrate 100, which may include a silicon oxide, silicon nitride, silicon oxynitride, or combinations thereof. Then, conventional methods may be performed to form an active layer 102, a dielectric layer 104, a gate electrode, and an upper electrode of a capacitor on the substrate 100 to form control elements of the display panel, such as transistors $T_1$ and $T_2$ and a capacitor C. Dielectric layers 106a and 106b are formed overlying the above mentioned elements. The dielectric layers 106a and 106b may include a silicon oxide, silicon nitride, silicon oxynitride, stacked layers thereof, or combinations thereof. Depending on requirement, different regions of the active layer 102 may be doped with different kinds of dopants to form, for example, source regions, drain regions, and lower electrode regions of the capacitors. In another embodiment, a light doping process may first be performed, followed by a heavy doping process after the gate electrodes are defined. Thus, LDD regions may be formed adjacent to the channel regions. Then, the dielectric layers 104, 106a, and 106b are patterned to form openings 106d and 106e respectively exposing the source region of the transistor $T_1$ and the drain region of the transistor $T_2$.

Figure 1B:
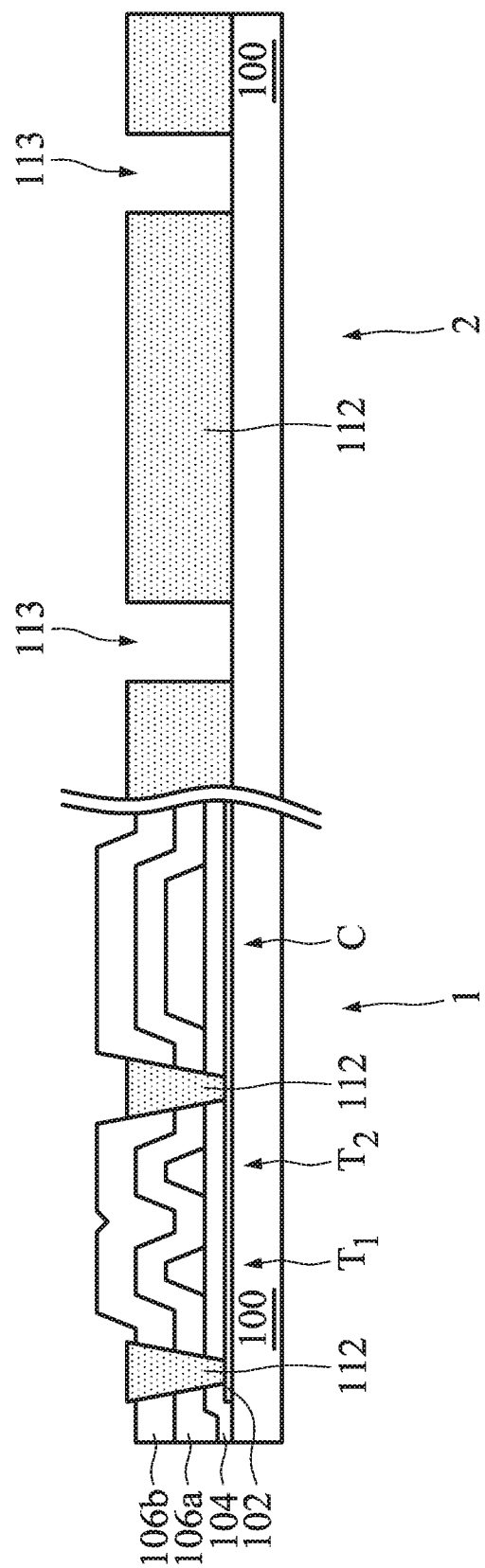

Referring to FIGS. 1B and 3, a conductive material deposition process and a selective etching process are performed to form a conducting layer 112 overlying the substrate 100 in the pixel region 1 and the peripheral region 2. The conducting layer 112 in the pixel region 1 fills into the openings 106d and 106e respectively exposing the source region of the transistor $T_1$ and the drain region of the transistor $T_2$ (as shown in FIG. 1A) and is electrically connected to the transistors $T_1$ and $T_2$ to serve as a data line. Meanwhile, the conducting layer 112 in the peripheral region 2 is formed on the substrate 100. First trenches 113 may be formed in the conducting layer 112 in the peripheral regions 2. The first trench 113 allows the stress to be released from the conducting layer 112 with larger area in the peripheral region 2. In addition, photoresist formed during the manufacturing process may be removed easily due to the forming of the first trench 113. It should be appreciated that types or location of the first trench 113 are not limited to what are shown in FIG. 3.

Figure 1C:
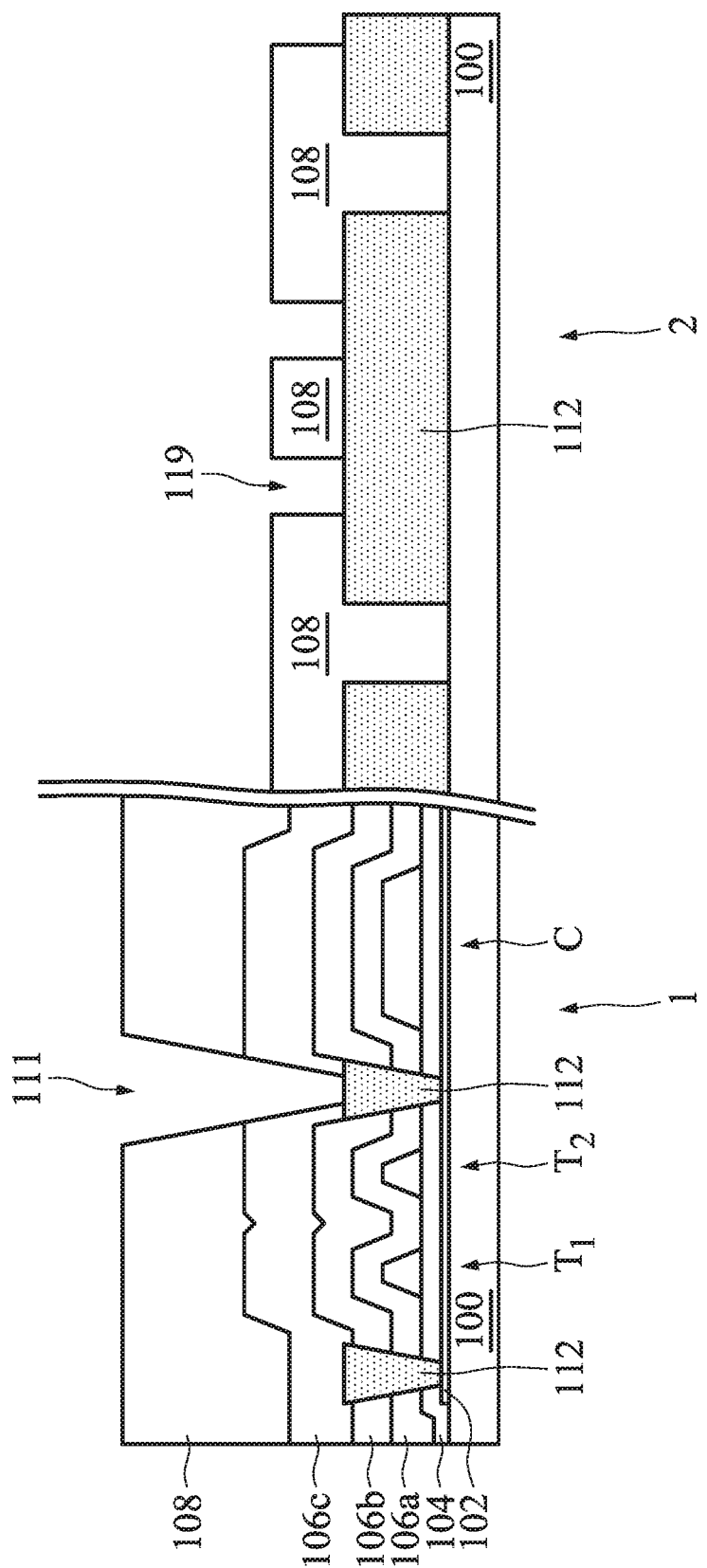

Referring to FIGS. 1C and 3, an insulating material forming process and a selective etching process are performed to form a first insulating layer 108 on the conducting layer 112 in the peripheral region 2. Meanwhile, the first insulating layer 108 is also formed overlying the substrate 100 in the pixel region 1. The first insulating layer 108 in the pixel region 1 has a contact opening 111 exposing the conducting layer 112 serving as the data line. It should be appreciated that the first insulating layer 108 in the peripheral region 2 has at least an opening 119 exposing the conducting layer 112. Thus, the first insulating layer 108 is island-shaped. For example, the first insulating layer 108 includes a plurality of separate square island regions as shown in FIG. 3. A ratio between an area of the first insulating layer 108 in the peripheral region 2 and an area of the conducting layer 112 thereunder is between about 0.27 and about 0.99, preferably between about 0.67 and about 0.80. In this embodiment, the first insulating layer 108 is formed by coating an organic insulating material using a spin coating method and by a photolithography and etching process. In one embodiment, the first insulating layer 108 in the peripheral region 2 fills into the first trench 113 in the conducting layer 112.

In one embodiment, a dielectric layer 106c may be formed overlying the dielectric layer 106b in the pixel region 1 before the forming of the first insulating layer 108.

Figure 1D:
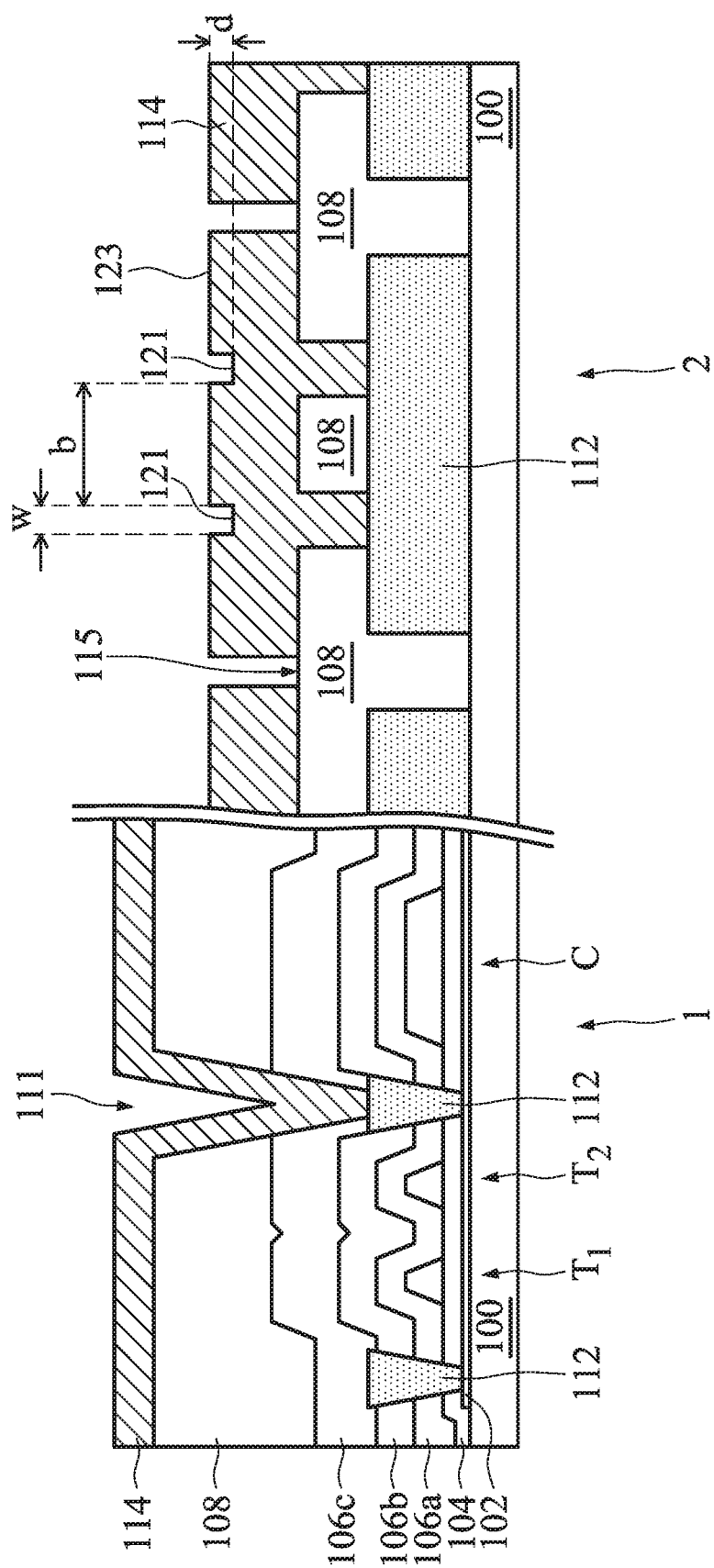

Referring to FIGS. 1D and 3, a conductive material deposition process and a selective etching process are then performed to conformally form a lower electrode layer 114 overlying the first insulating layer 108 in the pixel region 1 and the peripheral region 2. The lower electrode layer 114 may include at least a metal layer and/or other conducting layers. The lower electrode layer 114 in the pixel region 1 fills into the contact opening 111 (as shown in FIG. 1C) exposing the conducting layer 112 and is electrically connected to the conducting layer 112 serving as the data line. The lower electrode layer 114 in the peripheral region 2 is conformally formed overlying the first insulating layer 108 and has at least a recessed portion 121. In addition, the lower electrode layer 114 in the peripheral region 2 and the conducting layer 112 thereunder together serve as a conducting line, such as a power line, which may have a relatively wide line width and large area.

It should be appreciated that because the first insulating layer 108 in the peripheral region 2 has the opening 119, an upper surface of the conformally formed lower electrode layer 114 has a recessed portion 121 disposed corresponding to the position of the opening 119. The recessed portion 121 has a width w ranging between about 2.5 µm and about 300 µm . A spacing b between two adjacent recessed portions 121 is between about 20 µm and about 80 µm . A depth d of the recessed portion 121 is between about 0.08 µm and about 0.30 µm , preferably about 0.1 µm . In brief, the upper surface of the lower electrode layer 114 in the peripheral region 2 has protruding structures 123 since the upper surface has the recessed portion 121 corresponding to the opening 119 (as shown in FIG. 1C).

Further, in one embodiment, the upper surface of the lower electrode layer 114 in the peripheral region 2 has a surface roughness ranging between about 5% and about 40%. In another embodiment, the lower electrode layer 114 has a surface roughness ranging between about 10% and about 30%. In yet another embodiment, the lower electrode 114 has a surface roughness ranging between about 15% and about 25%, wherein the surface roughness is defined as a ratio between total area of an upper surface area and a side surface of the protruding structures 123 of the lower electrode layer 114 and a projection area of the entire lower conducting layer 114. Specifically, the surface roughness is the area percentage occupied by the upper surface area and the side surface area of the protruding structures 123.

Because the lower electrode layer 114 in the peripheral region 2 has a wider line width (or a larger area) and has high stress, at least a second trench 115 may be formed in the lower electrode layer 114 in the peripheral region 2 in one embodiment. The second trench 115 allows release of the high stress generated in the lower electrode layer 114 with large area in the peripheral region 2.

Figure 1E:
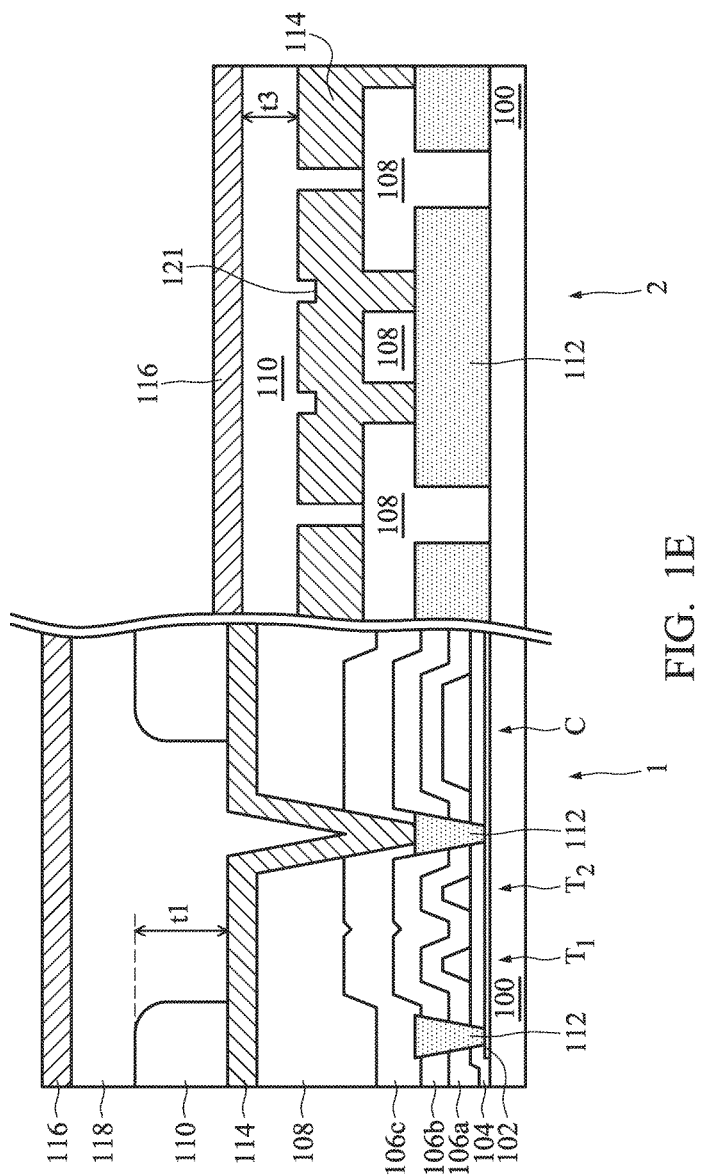

Referring to FIG. 1E, an organic insulating material is applied overlying the lower electrode layer 114 in the pixel region 1 and the peripheral region 2 by, for example spin coating. Then, a photolithography process and an etching process are performed to selectively etch the organic insulating material and to form a second insulating layer 110. The second insulating layer 110 in the pixel region 1 has an opening exposing the lower electrode layer 114 and serves as a pixel definition layer (PDL). It should be appreciated that because of the design of the opening 119 of the first insulating layer 108 in the peripheral region 2, the ratio between the area of the first insulating layer 108 in the peripheral region 2 and that of the conducting layer 112 thereunder is between about 0.27 and about 0.99. Thus, the upper surface of the subsequently formed lower electrode layer 114 has the recessed portions 121 having specific sizes and spacings. Specifically, the lower electrode layer 114 has a specific surface roughness ensuring a sufficient organic insulating material to be retained during the spin coating process for forming the second insulating layer 110. Therefore, the second insulating layer 110 in the peripheral region 2 may have sufficient thickness t3 ranging between about 1.5 µm and about 3 µm, preferably between about 2.0 µm and about 2.6 µm.

In one embodiment, the second insulating layer 110 formed in the pixel region 1 has a thickness t1 equal to the thickness t3 of the second insulating layer 110 in the peripheral region 2. Alternatively, the difference between the thicknesses of the second insulating layer 110 in the pixel region 1 and the peripheral region 2 is minimal.

Then, a light emitting layer 118 and an upper electrode layer 116 are formed overlying the second insulating layer 110 in the pixel region 1 to complete the fabrication of a display panel according to an embodiment of the invention. The upper electrode layer 116 is also formed overlying the second insulating layer 110 in the peripheral region 2.

As mentioned above, the surface morphology of the lower electrode layer 114 in the peripheral region 2 may be adjusted through the design of the opening 119 of the first insulating layer 108. The upper surface of the lower electrode layer 114 in the peripheral region 2 has specific recessed portions 121 and protruding structures 123, thus ensuring a sufficient organic insulating material to be retained during the spin coating process. Therefore, the second insulating layer 110 in the peripheral region 2 may have sufficient thickness, which is capable of preventing short between the lower electrode layer 114 and the upper electrode layer 116.

In addition, the first trench 113 and the second trench 115 are formed in the conducting layer 112 and the lower electrode layer 114 in the peripheral region 2, respectively, which are capable of releasing the high stress and improving the reliability of the display panel.

Figure 2B:
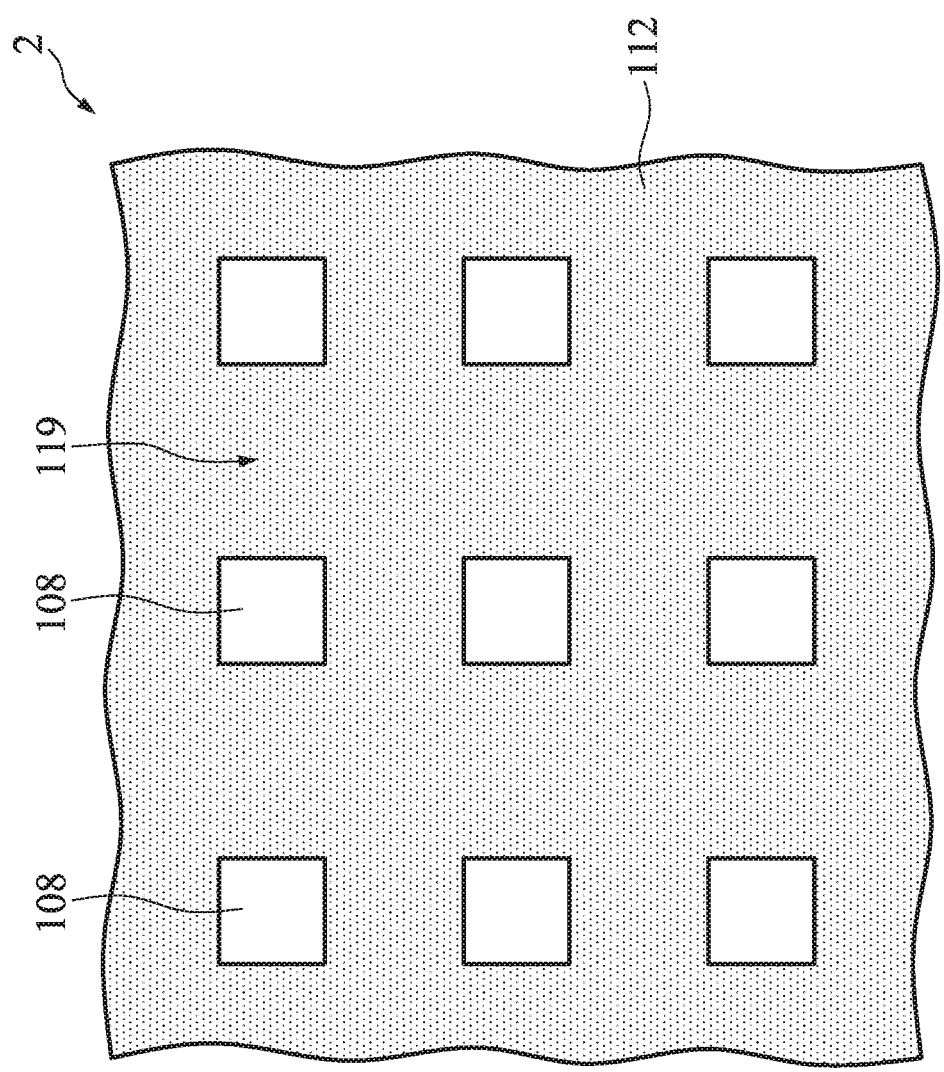
Figure 2C:
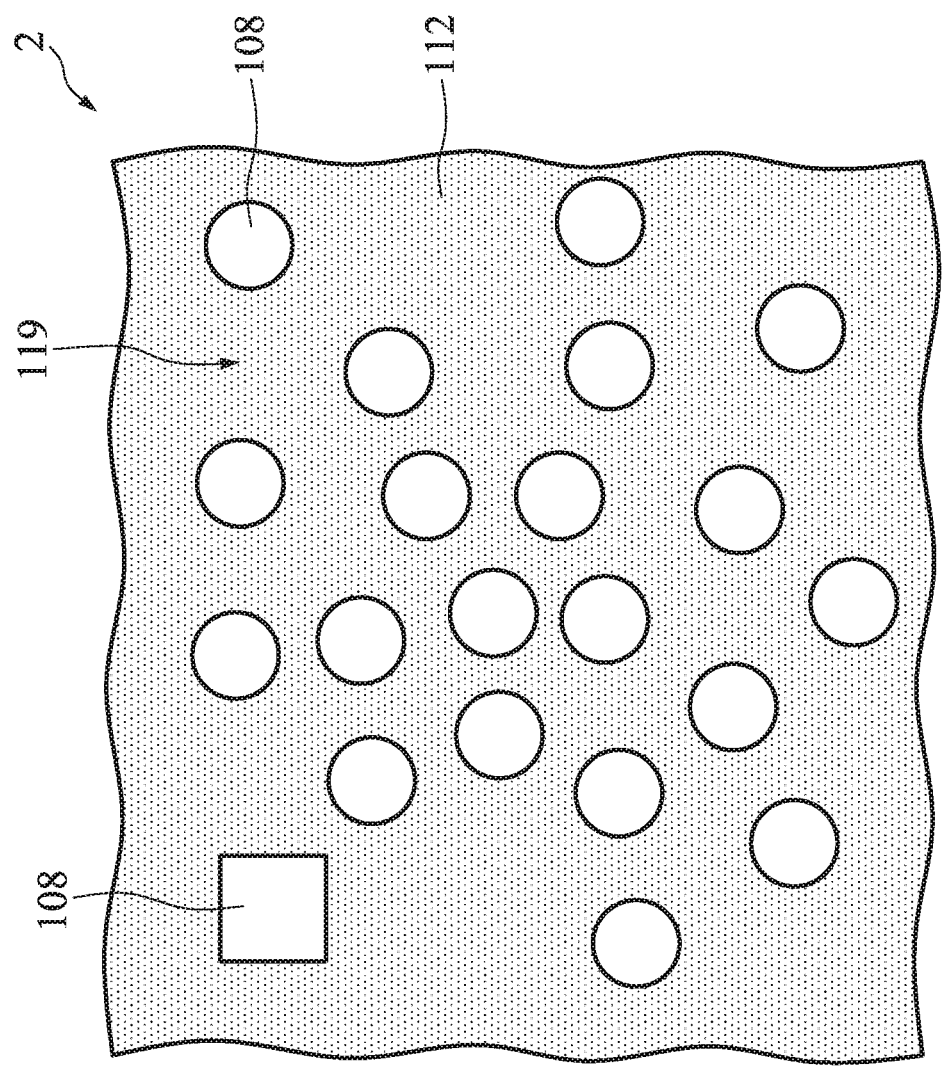
Figure 2D:
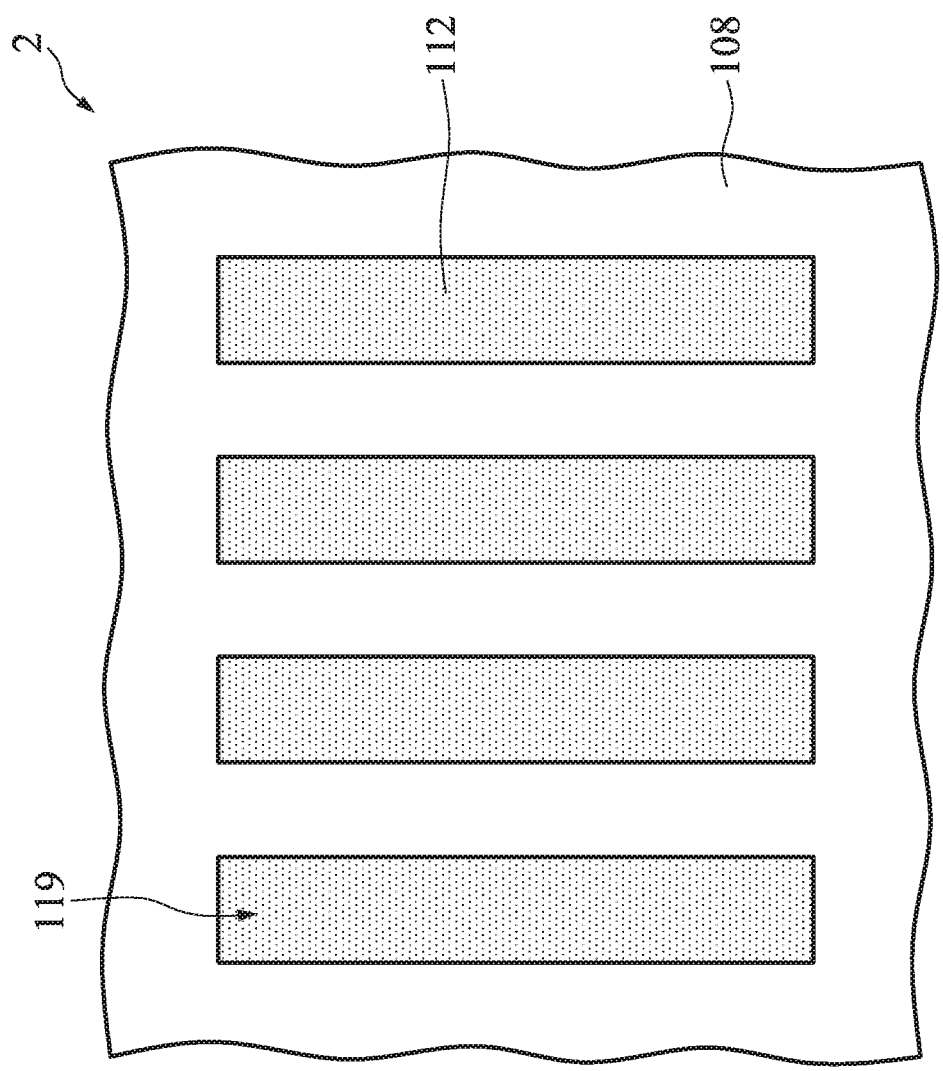

In the peripheral region 2, the type or layout of the openings 119 formed in the first insulating layer 108 is not limited to what is shown in FIG. 3. For example, in one embodiment, the openings 119 formed in the first insulating layer 108 in the peripheral region 2 may be arranged in an array, as shown in FIG. 2A. In another embodiment, the openings 119 may have shapes of squares or rectangles, such as that shown in FIG. 2D, or circles, polygons, or other irregular shapes (not shown). In yet another embodiment, the openings 119 formed in the first insulating layer 108 in the peripheral region 2 may cause the first insulating layer 108 to be island-shaped and to have separate island regions, as shown in FIG. 2B. The island regions may also be arranged in an array. Further, the first insulating layer 108 is not limited to have square island regions as shown in FIG. 2B. The first insulating layer 108 may have circle island regions and square island regions arranged irregularly, as shown in FIG. 2C.

In addition, the embodiment of the invention is not limited to AM-OLED panels and can be applied in other display panels.

FIG. 4 schematically shows a system for displaying images in accordance with an embodiment of the present invention, which is implemented as a display element 600 or an electronic element 800, such as a mobile phone, digital camera, personal digital assistant, portable computer, personal computer, television, vehicle display, or portable DVD. In this embodiment, the display element 600 comprises a display panel 400 according to an embodiment of the invention, such as the display panel shown in FIG. 3. In addition, in another embodiment, the display element 600 may be a portion of the electronic element 800. As shown in FIG. 4, the electronic element 800 comprises the display element 600 and an input element 700. The input element 700 is coupled to the display element 600 for providing signals, for example image signals, to the display element 600 to display images.

In addition, the display panel of the embodiment of the invention may be applied in kinds of electronic elements, such as a mobile phone, digital camera, personal digital assistant, portable computer, personal computer, television, vehicle display, or portable DVD.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display panel, comprising:
   a substrate having a pixel region and a peripheral region;
   a control element overlying the pixel region of the substrate;
   a first metal layer overlying the substrate in the peripheral region and in the pixel region;
   a first insulating layer formed on the first metal layer in the peripheral region, wherein the first insulating layer comprises at least an opening, and the opening is disposed on the first metal layer;
   a second metal layer overlying the first insulating layer and electrically connected to the first metal layer, wherein a portion of the second metal layer is disposed in the opening;
   a second insulating layer overlying the second metal layer; and
   an electrode layer disposed on the second insulating layer.

2. The display panel as claimed in claim 1, wherein the opening has a shape of a rectangle, a circle, a polygon, or other irregular shapes.

3. The display panel as claimed in claim 1, wherein the first insulating layer comprises a plurality of openings, and the plurality of openings has different shapes.

4. The display panel as claimed in claim 1, wherein the first insulating layer comprises a plurality of openings, and the plurality of openings is arranged in a line.

5. The display panel as claimed in claim 1, wherein a thickness of the second insulating layer in the pixel region is equal to a thickness of the second insulating layer in the peripheral region.

6. The display panel as claimed in claim 1, further comprising a light emitting layer disposed between the second metal layer and the electrode layer in the pixel region.

7. The display panel as claimed in claim 1, wherein an upper surface of the second metal layer comprises at least a recessed portion corresponding to the portion of the second metal layer disposed in the opening.

8. The display panel as claimed in claim 7, wherein a portion of the second insulating layer is disposed in the recessed portion.

9. The display panel as claimed in claim 7, wherein the opening is wider than the recessed portion.

10. The display panel as claimed in claim 1, wherein a top surface of the second insulating layer in the peripheral region is flat, and a bottom surface of the second insulating layer in the peripheral region is rough.

11. The display panel as claimed in claim 1, wherein the first metal layer in the pixel region is electrically connected to the control element for serving as a data line.

12. The display panel as claimed in claim 11, wherein the first insulating layer has a contact opening in the pixel region exposing the data line.

13. The display panel as claimed in claim 12, wherein the second metal layer fills into the contact opening and is electrically connected to the data line.

14. An electronic element, comprising:
a display element comprising a display panel, wherein the display panel comprises:
a substrate having a pixel region and a peripheral region;
a control element overlying the pixel region of the substrate;
a first metal layer overlying the substrate in the peripheral region and in the pixel region;
a first insulating layer formed on the first metal layer in the peripheral region, wherein the first insulating layer comprises at least an opening, and the opening is disposed on the first metal layer;
a second metal layer overlying the first insulating layer and electrically connected to the first metal layer, wherein a portion of the second metal layer is disposed in the opening;
a second insulating layer overlying the second metal layer; and
an electrode layer disposed on the second insulating layer.

15. The electronic element as claimed in claim 14, further comprising:
an input element, wherein the input element is coupled to the display element and provides a signal to the display element for displaying images.

16. The electronic element as claimed in claim 14, wherein the electronic element is a mobile phone, a digital camera, a personal digital assistant, a portable computer, a personal computer, a television, a vehicle display, or a portable DVD.

17. The electronic element as claimed in claim 14, wherein the opening has a shape of a rectangle, a circle, a polygon, or other irregular shapes.

18. The electronic element as claimed in claim 14, wherein the first insulating layer comprises a plurality of openings, and the plurality of openings has different shapes.

19. The electronic element as claimed in claim 14, wherein the first insulating layer comprises a plurality of openings, and the plurality of openings is arranged in a line.

20. The electronic element as claimed in claim 14, wherein an upper surface of the second metal layer comprises at least a recessed portion corresponding to the portion of the second metal layer disposed in the opening, and wherein a portion of the second insulating layer is disposed in the recessed portion.

* * * * *